(12) United States Patent
Jang et al.

(10) Patent No.: US 12,029,101 B2
(45) Date of Patent: Jul. 2, 2024

(54) MASK-FRAME ASSEMBLY AND METHOD OF MANUFACTURING ORGANIC LIGHT EMITTING DISPLAY APPARATUS BY USING THE SAME

(71) Applicant: SAMSUNG DISPLAY CO., LTD., Yongin-si (KR)

(72) Inventors: Minji Jang, Yongin-si (KR); Jongdae Lee, Yongin-si (KR); Jongbum Kim, Yongin-si (KR); Sanghoon Kim, Yongin-si (KR); Sangheon Jeon, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 587 days.

(21) Appl. No.: 17/347,509

(22) Filed: Jun. 14, 2021

(65) Prior Publication Data

US 2022/0102638 A1 Mar. 31, 2022

(30) Foreign Application Priority Data

Sep. 28, 2020 (KR) .......................... 10-2020-0126369

(51) Int. Cl.
*H01L 51/00* (2006.01)
*C23C 14/04* (2006.01)
(Continued)

(52) U.S. Cl.
CPC ......... *H10K 71/166* (2023.02); *C23C 14/042* (2013.01); *C23C 14/24* (2013.01);
(Continued)

(58) Field of Classification Search
CPC ..... C23C 16/042; C23C 14/24; C23C 14/042; C23C 14/04; H10K 71/166; H10K 71/164; H01L 21/0337; C30B 25/04
See application file for complete search history.

(56) References Cited

U.S. PATENT DOCUMENTS 8,471,275 B2 6/2013 Lee et al.
9,284,638 B2 3/2016 Ko et al.
(Continued)

FOREIGN PATENT DOCUMENTS

KR 1020110087829 8/2011
KR 10-1659960 9/2016
(Continued)

*Primary Examiner* — Jaehwan Oh
(74) *Attorney, Agent, or Firm* — F. Chau & Associates, LLC

(57) ABSTRACT

Provided are a mask-frame assembly including (i) a frame including an opening portion, (ii) an open mask coupled to the frame to cover the opening portion and including a main portion including a plurality of openings located in the opening portion, a first rib connected to the main portion and extending in a first direction away from a center of the main portion, a second rib connected to the main portion and extending in a second direction across the first direction and away from the center of the main portion, and a first bridge portion connecting a first edge of the first rib in a direction toward the second rib to a second edge of the second rib in a direction toward the first rib, and (iii) mask sticks overlapping the open mask, having both ends coupled to the frame, and including a plurality of holes.

25 Claims, 14 Drawing Sheets

(51) Int. Cl.
  *C23C 14/24* (2006.01)
  *H10K 59/12* (2023.01)
  *H10K 71/00* (2023.01)
  *H10K 71/16* (2023.01)

(52) U.S. Cl.
  CPC ............ *H10K 59/12* (2023.02); *H10K 71/00* (2023.02); *H10K 71/164* (2023.02)

(56) References Cited

U.S. PATENT DOCUMENTS

| | | |
|---|---|---|
| 10,238,475 B1 | 3/2019 | Kim |
| 2018/0026189 A1* | 1/2018 | Kim ...................... H05B 33/10 438/401 |
| 2020/0238328 A1* | 7/2020 | Lee ......................... C23C 14/04 |
| 2021/0371966 A1* | 12/2021 | Niu ......................... G06F 30/20 |

FOREIGN PATENT DOCUMENTS

| | | |
|---|---|---|
| KR | 10-2017-0141854 | 12/2017 |
| KR | 10-1135544 | 4/2021 |

\* cited by examiner

MASK-FRAME ASSEMBLY AND METHOD OF MANUFACTURING ORGANIC LIGHT EMITTING DISPLAY APPARATUS BY USING THE SAME

CROSS-REFERENCE TO RELATED APPLICATION

This application claims priority under 35 U.S.C. § 119 to Korean Patent Application No. 10-2020-0126369, filed on Sep. 28, 2020, in the Korean Intellectual Property Office, the disclosure of which is incorporated by reference herein in its entirety.

TECHNICAL FIELD

The present disclosure relates to a mask-frame, and more particularly, to a mask-frame assembly and a method of manufacturing an organic light emitting display apparatus by using the mask-frame assembly.

DISCUSSION OF THE RELATED ART

In the process of manufacturing various display apparatuses including organic light emitting diode (OLED) display apparatuses, a process of forming a second layer of a preset pattern over a first layer by using a mask is performed. This process is generally referred to as deposition.

When a mask is used to deposit the second layer, the mask should be supported so as not to sag and thereby distort the geometry of the second layer as it is deposited. Accordingly, a tensile force is applied to the mask to fix the mask to a frame. However, there is a concern in that the shape of a deposition area of the mask may be deformed in this process.

SUMMARY

According to one or more embodiments of the present disclosure, a mask-frame assembly includes (i) a frame including an opening portion, (ii) an open mask coupled to the frame and covering the opening portion and including a main portion including a plurality of openings located in the opening portion, a first rib connected to the main portion and extending in a first direction away from a center of the main portion, a second rib connected to the main portion and extending in a second direction that crosses the first direction and away from the center of the main portion, and a first bridge portion connecting a first edge of the first rib in a direction toward the second rib to a second edge of the second rib in a direction toward the first rib, and (iii) mask sticks overlapping the open mask, each of the mask sticks having opposite ends coupled to the frame, and including a plurality of holes.

The main portion, the first rib, the second rib, and the first bridge portion may all be integrally formed as one contiguous body.

An edge of the first bridge portion in a direction opposite to a direction toward the main portion may have a concave shape in the direction toward the main portion.

An edge of the first bridge portion in the direction opposite to the direction toward the main portion may have a curved shape.

An edge of an opening closest to the first bridge portion among the plurality of openings may include a portion having a shape symmetrical to a shape of the edge of the first bridge portion in the direction opposite to the direction toward the main portion.

The edge of the first bridge portion in the direction opposite to the direction toward the main portion may have a shape of a segment of a circle having a radius R1.

The edge of the first bridge portion in the direction opposite to the direction toward the main portion may have a shape of a segment of a circle having a radius R1.

An edge of an opening closest to the first bridge portion among the plurality of openings may have a shape of at least a segment of a circle having a radius R2.

The radius R1 may be about 25% or more of the radius R2.

The open mask may further include a third rib connected to the main portion, spaced apart from the first rib, and extending in the first direction, and a second bridge portion connecting an edge of a portion of the main portion between the third rib and the first rib to a third edge of the third rib in the direction toward the first rib.

The main portion, the first rib, the second rib, the third rib, the first bridge portion, and the second bridge portion may all be integrally formed as one contiguous body.

An edge of the second bridge portion in the direction toward the first rib may have a concave shape in a direction toward an intersection point between the edge of the portion of the main portion between the third rib and the first rib and an imaginary straight line in an extension direction of the third rib.

The edge of the second bridge portion in the direction toward the first rib may have a curved shape.

An edge of an opening among the plurality of openings which is closest to the intersection point in a direction opposite to a direction toward the second bridge portion with respect to the intersection point, may include a portion having a shape symmetrical to a shape of an edge of the second bridge portion in a direction opposite to the direction toward the intersection point.

The edge of the second bridge portion in the direction toward the first rib may have a shape of a segment of a circle having a radius R1.

The edge of the second bridge portion in the direction toward the first rib may have a shape of a segment of a circle having a radius R1.

An edge of an opening among the plurality of openings which is closest to the intersection point in a direction opposite to a direction toward the second bridge portion with respect to the intersection point, may have a shape of at least a segment of a circle having a radius R2.

The radius R1 may be about 25% or more of the radius R2.

An edge of the first bridge portion in a direction opposite to a direction toward the main portion may have a linear shape.

An edge of an opening among the plurality of openings which is closest to the first bridge portion may have a shape of at least a segment of a circle having a radius R2, and a length of the edge of the first bridge portion in the direction opposite to the direction toward the main portion may be about 35% or more of the radius R2 and may be about 100% or less of the R2.

The mask-frame assembly may further include a cleaning liquid discharge port located at the first bridge portion.

According to one or more embodiments, a method of manufacturing an organic light emitting display apparatus includes forming a pixel electrode over a substrate, forming an intermediate layer over the pixel electrode by using any one of the above mask-frame assemblies, and forming an opposite electrode over the intermediate layer.

According to one or more embodiments of the present disclosure, a mask-frame assembly includes a frame including an open portion, and an open mask coupled to the frame. The open mask includes a first rib extending in a first direction, a second rib extending in a second direction that is different from the first direction, and a bridge portion that connects the first rib and the second rib, the bridge portion having a curved shape. The open mask further includes a plurality of openings.

Each of the plurality of openings may correspond to a display apparatus to be manufactured. Each of the plurality of openings may have a shape of a circle segment.

BRIEF DESCRIPTION OF THE DRAWINGS

The above and other aspects, features, and elements of certain embodiments will be more apparent from the following description taken in conjunction with the accompanying drawings, in which.

DETAILED DESCRIPTION

Figure 1:
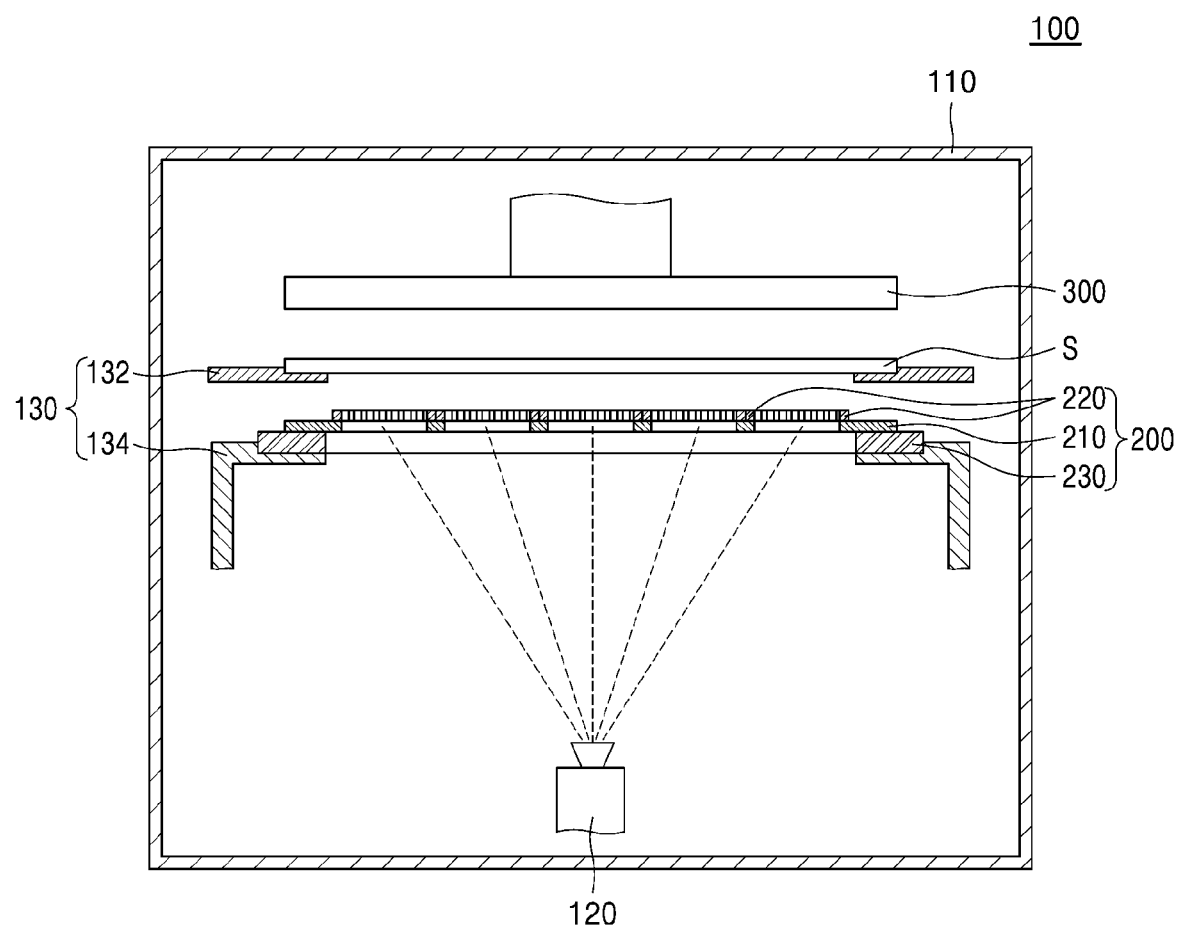
FIG. 1 is a conceptual diagram schematically illustrating a deposition apparatus for performing deposition by using a mask-frame assembly according to an embodiment of the present disclosure.

Reference will now be made in detail to embodiments, examples of which are illustrated in the accompanying drawings, wherein like reference numerals may refer to like elements throughout the specification and drawings. In this regard, the present embodiments may have different forms and should not necessarily be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not necessarily limited to the embodiments described below and may be embodied in various modes.

Hereinafter, embodiments will be described in detail with reference to the accompanying drawings, and in the following description, like reference numerals may denote like elements and to the extent that descriptions of certain elements are omitted from the specification, it may be assumed that these elements are at least similar to corresponding elements that are described elsewhere within the specification.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description.

Also, herein, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a conceptual diagram schematically illustrating a deposition apparatus 100 for performing deposition by using a mask-frame assembly according to an embodiment of the present disclosure.

As illustrated in FIG. 1, the deposition apparatus 100 may include a process chamber 110, a deposition source 120 located at one side of the process chamber 110, a mask-frame assembly 200 disposed between the deposition source 120 and a substrate S, and a holder 130 configured to support the substrate S. Also, the deposition apparatus 100 may further include various other components as desired. For example, the deposition apparatus 100 may further include a contact unit 300 configured to press the substrate S and the mask-frame assembly 200 together. The contact unit 300 may include, for example, a permanent magnet or an electromagnet.

The process chamber 110 may provide a space in which a deposition process for depositing a thin film of a predetermined pattern on the substrate S may be performed. The deposition source 120 capable of storing and emitting a material to be deposited on the substrate S may be located at one side in the process chamber 110. The holder 130 may support the substrate S and the mask-frame assembly 200 such that the positions of the substrate S and the mask-frame assembly 200 might not be changed during deposition. The holder 130 may include a first holder 132 for supporting the substrate S and a second holder 134 for supporting the mask-frame assembly 200. In this case, the mask-frame assembly 200 may be disposed between the substrate S and the deposition source 120, as illustrated in FIG. 1.

The mask-frame assembly 200 may allow a deposition target material emitted from the deposition source 120 to be deposited as a thin film of a predetermined pattern on the substrate S. For this purpose, the mask-frame assembly 200 may include mask sticks 220, an open mask 210, and a frame 230 in which openings of a shape corresponding to the shape of a thin film to be formed on the substrate S are formed.

Figure 2:
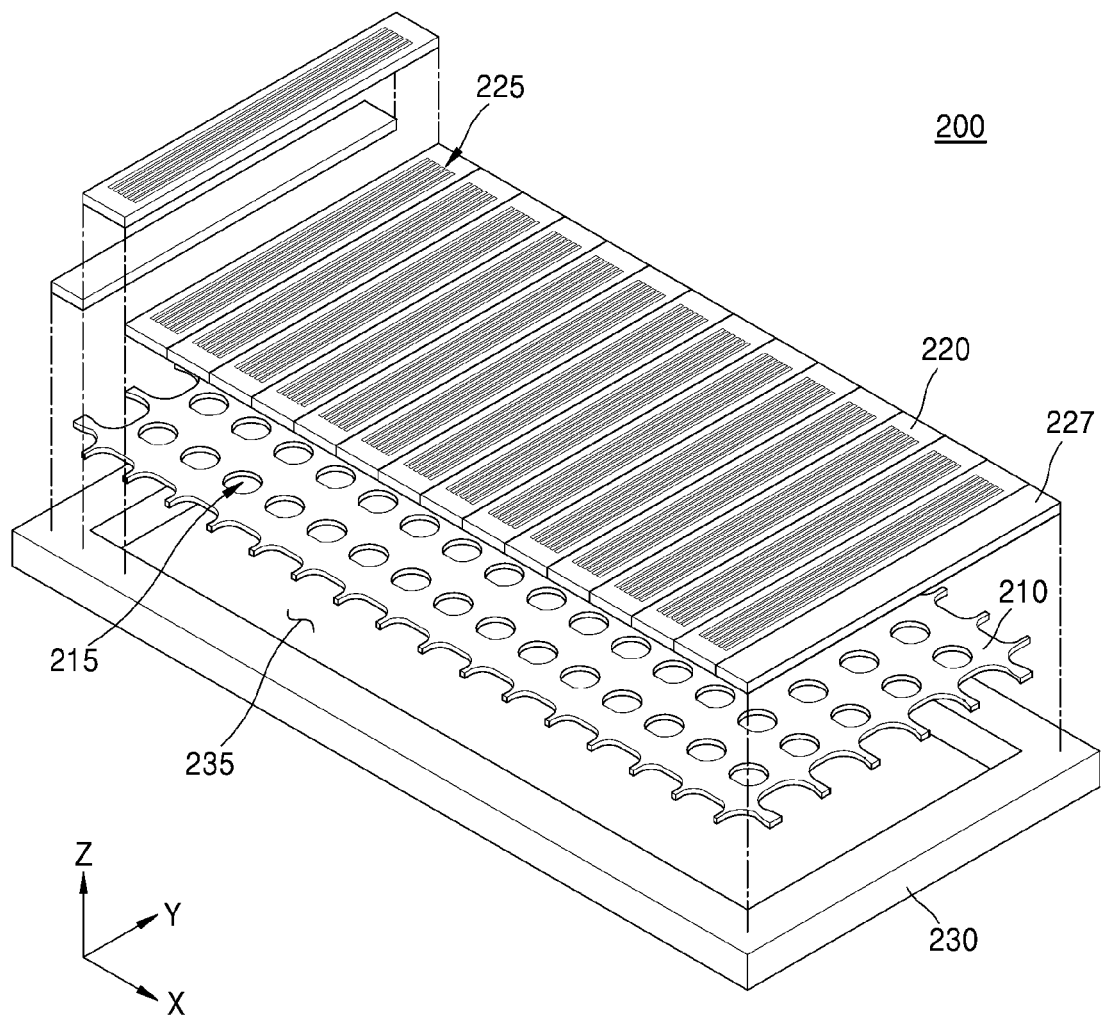
FIG. 2 is an exploded perspective view schematically illustrating a mask-frame assembly according to an embodiment of the present disclosure.

FIG. 2 is an exploded perspective view schematically illustrating a mask-frame assembly 200 according to an embodiment. As illustrated in FIG. 2, the mask-frame assembly 200 according to the present embodiment may include a frame 230, an open mask 210, and mask sticks 220.

The frame 230 may include an opening portion 235. The frame 230 may define an overall appearance of the mask-frame assembly 200 and may also support the open mask 210 and the mask sticks 220. The frame 230 may include various materials and may include, for example, a nickel-iron alloy such as 64FeNi (e.g. Invar) or the like to minimize deformation or the like in a high-temperature environment in which deposition is performed and to minimize the damage by a cleaning liquid or the like even in a cleaning process after use.

The open mask 210 may be coupled to the frame 230 to cover the opening portion 235 of the frame 230, and as illustrated in FIG. 2, the open mask 210 may include a plurality of openings 215 located within the opening portion 235 of the frame 230. Each of the openings 215 may correspond to, for example, a display apparatus to be manufactured. FIG. 2 illustrates the mask-frame assembly 200 that may be used to simultaneously manufacture a plurality of display apparatuses including a display area substantially having a circular shape, for example, a shape of a circular segment, as shown. However, the disclosure is not necessarily limited thereto, and the shape of the openings 215 of the open mask 210 may be variously modified. The open mask 210 may be formed of, for example, Invar.

When the open mask 210 sags under its own weight, the shape of a layer formed on the substrate S by deposition may be different from the desired shape thereof. Thus, to prevent such a situation from occurring, the open mask 210 may be coupled to the frame 230 in a state where a force directed outwardly from the center of the opening portion 235 of the frame 230 is applied to the open mask 210. The frame 230 may have sufficient thickness and rigidity to prevent deformation by a tensile force applied to the open mask 210 or to minimize the degree of the deformation. The open mask 210 may be coupled to the frame 230 by, for example, adhesion, soldering, welding, or the like.

Each of the mask sticks 220 may have, for example, a shape extending in one direction (which may be referred to as the y-axis direction) as illustrated in FIG. 2. Each of the mask sticks 220 may overlap the open mask 210, and both ends thereof in the extension direction (y-axis direction) may be coupled to the frame 230. The mask stick 220 may include a plurality of holes 225, and each of the holes 225 may have a slit shape extending in one direction (which may be referred to as the y-axis direction) as illustrated in FIG. 2. However, the disclosure is not necessarily limited thereto, and the shape of the holes 225 of the mask stick 220 may be variously modified. The holes 225 formed in each of the mask sticks 220 may correspond to the shape of a layer to be formed on the substrate S.

When the mask stick 220 is sagged by its own weight, the shape of a layer formed on the substrate S by deposition may be different from a preset shape thereof. Thus, to prevent such a situation from occurring, the mask stick 220 may be coupled to the frame 230 in a state where both ends (in the +y direction and the −y direction) of the mask stick 220 are pulled in opposite directions. The frame 230 may have sufficient thickness and rigidity to prevent deformation by a tensile force applied to the mask stick 220 or to minimize the degree of the deformation. The mask stick 220 may be coupled to the frame 230 by, for example, adhesion, soldering, welding, or the like.

The mask stick 220 may be formed of a thin metal plate. For example, the mask stick 220 may include a thin nickel plate or the like.

Moreover, FIG. 2 illustrates that shielding masks 227 are located outside (+x direction and −x direction) the mask sticks 220 and coupled to the frame 230. Unlike the mask stick 220, the shielding mask 227 might not include any holes. The shielding mask 227 may prevent a material from being unnecessarily deposited at the edge of the substrate S.

Figure 3:
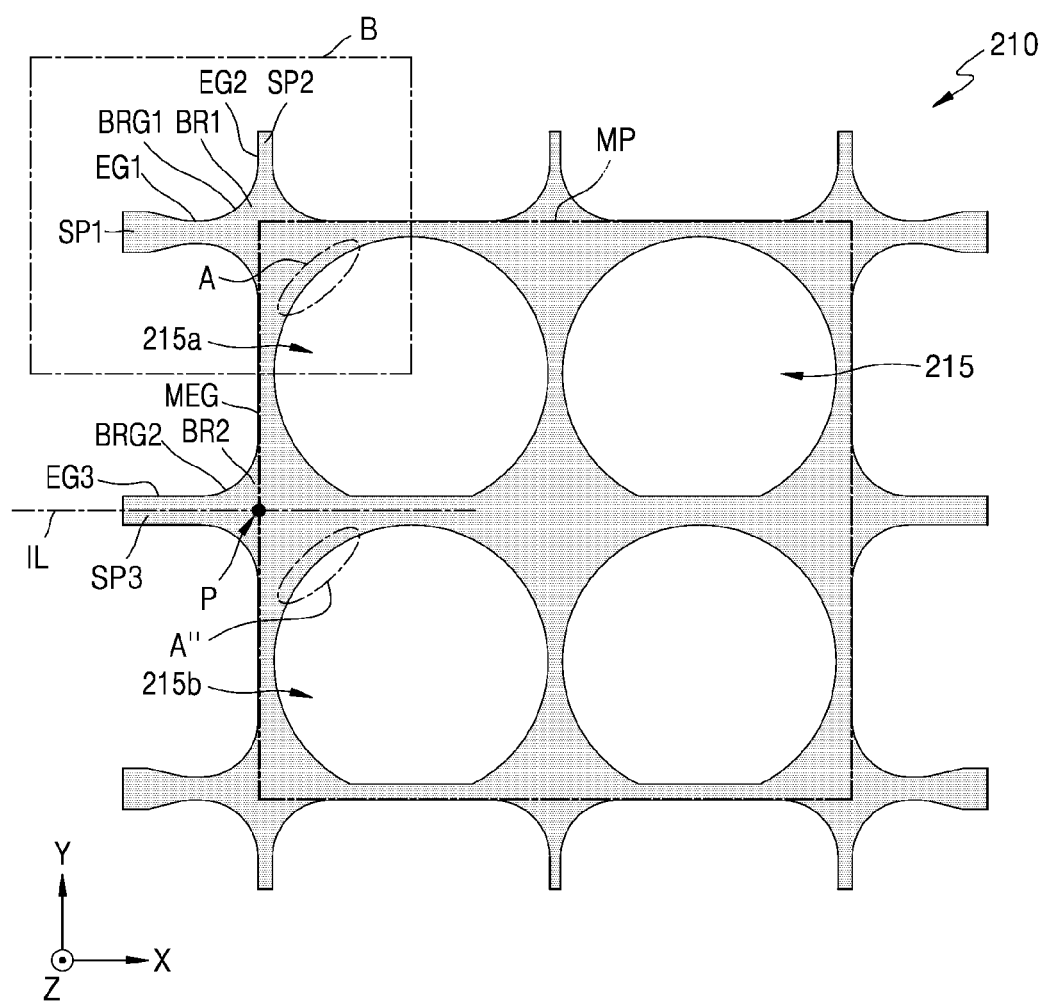
FIG. 3 is a plan view schematically illustrating an open mask that may be included in the mask-frame assembly of FIG. 2.
Figure 4:
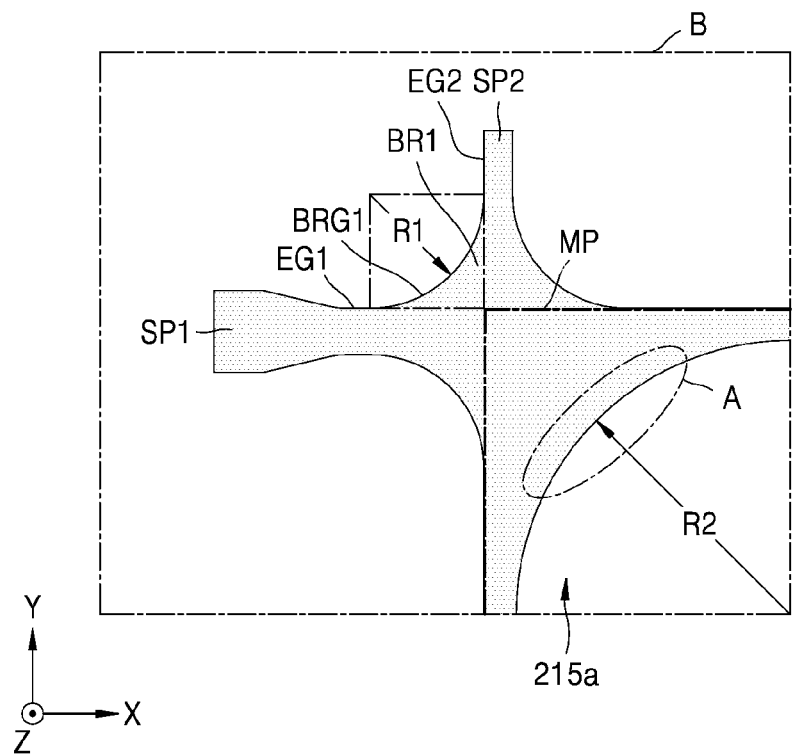
FIG. 4 is a plan view schematically illustrating region B of FIG. 3.

FIG. 3 is a plan view schematically illustrating an open mask 210 that may be included in the mask-frame assembly 200 of FIG. 2, and FIG. 4 is a plan view schematically illustrating region B of FIG. 3. For convenience, FIG. 3 illustrates that the open mask 210 includes four openings 215.

The open mask 210 may be coupled to the frame 230 to cover the opening portion 235 of the frame 230 as described above. The open mask 210 may include a main portion MP, a first rib SP1, a second rib SP2, and a first bridge portion BR1. The main portion MP, the first rib SP1, the second rib SP2, and the first bridge portion BR1 may be integrally formed as one body as illustrated in FIGS. 3 and 4.

The main portion MP may be a portion forming an approximate shape of the open mask 210 and may include a plurality of openings 215 located within the opening portion 235 of the frame 230. For example, the main portion MP may occupy most of the open mask 210 that does not contact the frame 230.

The first rib SP1 may be connected to the main portion MP. The first rib SP1 may have a shape extending primarily in a first direction (−x direction) away from the center of the main portion MP. The second rib SP2 may also be connected to the main portion MP, and the second rib SP2 may extend primarily in a second direction (+y direction) away from the center of the main portion MP and across the first direction (−x direction) in which the first rib SP1 extends. The first bridge portion BR1 may connect the first rib SP1 to the second rib SP2. For example, the first bridge portion BR1 may connect a first edge EG1 of the first rib SP1 in the direction toward the second rib SP2 to a second edge EG2 of the second rib SP2 in the direction toward the first rib SP1.

As described above, the open mask 210 may be coupled to the frame 230 in a state where a force directed outward from the center of the opening portion 235 of the frame 230 is applied to the open mask 210. For example, the open mask 210 may be coupled to the frame 230 in a state where tension is applied to the first rib SP1 in the direction (−x direction) in which the first rib SP1 extends and tension is applied to the second rib SP2 in the direction (+y direction) in which the second rib SP2 extends.

Figure 5:
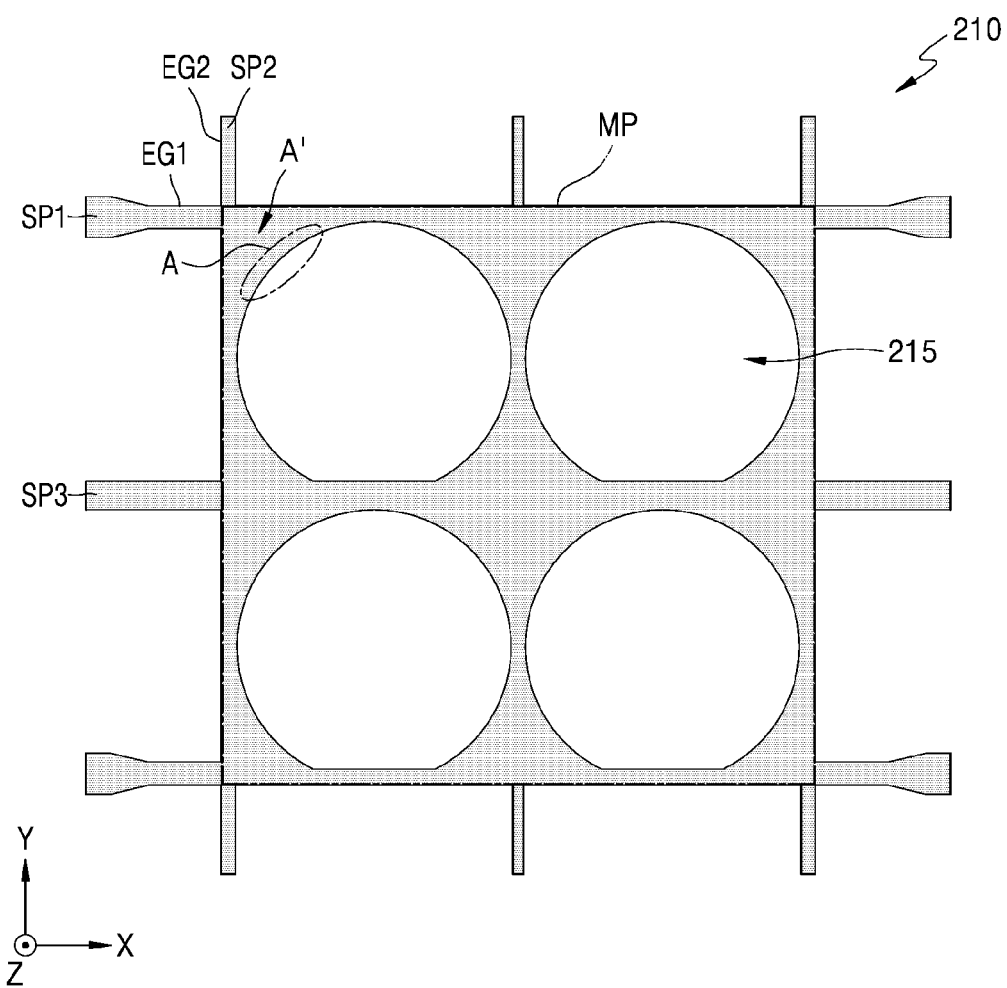
FIG. 5 is a plan view schematically illustrating a mask-frame assembly according to a comparative example.

When the open mask 210 does not include the first bridge portion BR1, the open mask 210 may have a shape illustrated in FIG. 5 that is a plan view schematically illustrating a mask-frame assembly according to a comparative example. In the case of an open mask 210 according to the comparative example, when tension is applied to the first rib SP1 in the direction (−x direction) in which the first rib SP1 extends and tension is applied to the second rib SP2 in the direction (+y direction) in which the second rib SP2 extends, the shape of a portion A of the opening closest to the first rib SP1 and the second rib SP2, which is adjacent to the first rib SP1 and the second rib SP2, may be deformed. Further, deformation of an uneven shape such as a wave may occur in an area A' between the first rib SP1 and/or the second rib SP2 and the portion A. This may eventually degrade the quality of a deposited layer, thus degrading the quality of a manufactured display apparatus or causing a defect in the display apparatus.

However, the open mask 210 included in the mask-frame assembly 200, according to an embodiment of the present disclosure, may include a first bridge portion BR1 as described above with reference to FIGS. 3 and 4. When tension is applied to the first rib SP1 in the direction (−x direction) in which the first rib SP1 primarily extends and tension is applied to the second rib SP2 in the direction (+y direction) in which the second rib SP2 primarily extends, the first bridge portion BR1 may effectively prevent or minimize the concentration of stress on a portion A of an opening 215a closest to the first rib SP1 and the second rib SP2, which is adjacent to the first rib SP1 and the second rib SP2. Accordingly, the deformation of the shape of the opening 215a in the portion A may be prevented or minimized.

An edge BRG1 of the first bridge portion BR1 in the direction opposite to the direction toward the main portion MP may have a concave shape in the direction toward the main portion MP as illustrated in FIGS. 3 and 4. In this case, the edge BRG1 of the first bridge portion BR1 in the direction opposite to the direction toward the main portion MP may have a curved shape as illustrated in FIGS. 3 and 4. Accordingly, when tension is applied to the first rib SP1 in the direction (−x direction) in which the first rib SP1 extends and tension is applied to the second rib SP2 in the direction (+y direction) in which the second rib SP2 extends, the tension may be effectively distributed in the first bridge portion BR1. This may effectively prevent or minimize the concentration of the stress on the portion A of the opening 215a closest to the first rib SP1 and the second rib SP2, which is adjacent to the first rib SP1 and the second rib SP2.

For example, the edge of the opening 215a which is closest to the first bridge portion BR1 among the plurality of openings 215 of the open mask 210 may include a portion A having a shape substantially corresponding to the shape of the edge BRG1 of the first bridge portion BR1 in the direction opposite to the direction toward the main portion MP. Conversely, it may be understood that the shape of the edge BRG1 of the first bridge portion BR1 in the direction opposite to the direction toward the main portion MP corresponds to the shape of the portion A of the opening 215a closest to the first bridge portion BR1.

Accordingly, a portion of the open mask 210 that is surrounded by the first rib SP1, the second rib SP2, and the opening 215a closest to the first bridge portion BR1, among the plurality of openings 215 of the open mask 210, may have a shape substantially similar to the shape of a portion of the open mask 210 that is surrounded by the openings 215 (e.g., a center portion of the open mask 210 of FIG. 3). As a result, the application of stress of a different magnitude than other portions to the portion A of the opening 215a closest to the first rib SP1 and the second rib SP2, which is adjacent to the first rib SP1 and the second rib SP2, may be minimized. When stress of a meaningfully different size than other portions is applied to the portion A of the opening 215a closest to the first rib SP1 and the second rib SP2, which is adjacent to the first rib SP1 and the second rib SP2, an unexpected localized deformation may occur in that portion.

As illustrated in FIG. 4, the portion A of the opening 215a closest to the first rib SP1 and the second rib SP2, which is adjacent to the first rib SP1 and the second rib SP2, may have the shape of at least a segment of a circle having a radius R2. As used herein, the phrase "segment of a circle having a radius X" refers to a circular segment that is a circle with a radius X that has a flat side as if a portion of the circle has been removed by a cord (a line between two points on the circle). In this case, the edge BRG1 of the first bridge portion BR1 in the direction opposite to the direction toward the main portion MP may also have the shape of a segment of a circle. FIG. 4 illustrates that the edge BRG1 of the first bridge portion BR1 in the direction opposite to the direction toward the main portion MP has the shape of a segment of a circle having a radius R1. In this case, the radius R1 may be about 25% or more of the radius R2.

If R1 is less than about 25% of R2, when tension is applied to the first rib SP1 in the direction (−x direction) in which the first rib SP1 extends and tension is applied to the second rib SP2 in the direction (+y direction) in which the second rib SP2 extends, the tension might not be effectively distributed in the first bridge portion BR1. This may result in the deformation of the shape of the portion A of the opening closest to the first rib SP1 and the second rib SP2, which is adjacent to the first rib SP1 and the second rib SP2. Further, deformation of an uneven shape such as a wave may occur in an area A' between the first rib SP1 and/or the second rib SP2 and the portion A. This may eventually degrade the quality of a deposited layer, thus degrading the quality of a manufactured display apparatus or causing a defect in the display apparatus. Thus, for example, the radius R1 may be about 25% or more of the radius R2.

For reference, a curvature radius R1 of the edge BRG1 of the first bridge portion BR1 in the direction opposite to the direction toward the main portion MP may theoretically be infinite. That R1 is infinite may mean that the edge BRG1 of the first bridge portion BR1 in the direction opposite to the direction toward the main portion MP has a linear shape, and this case will be described below.

Figure 6:
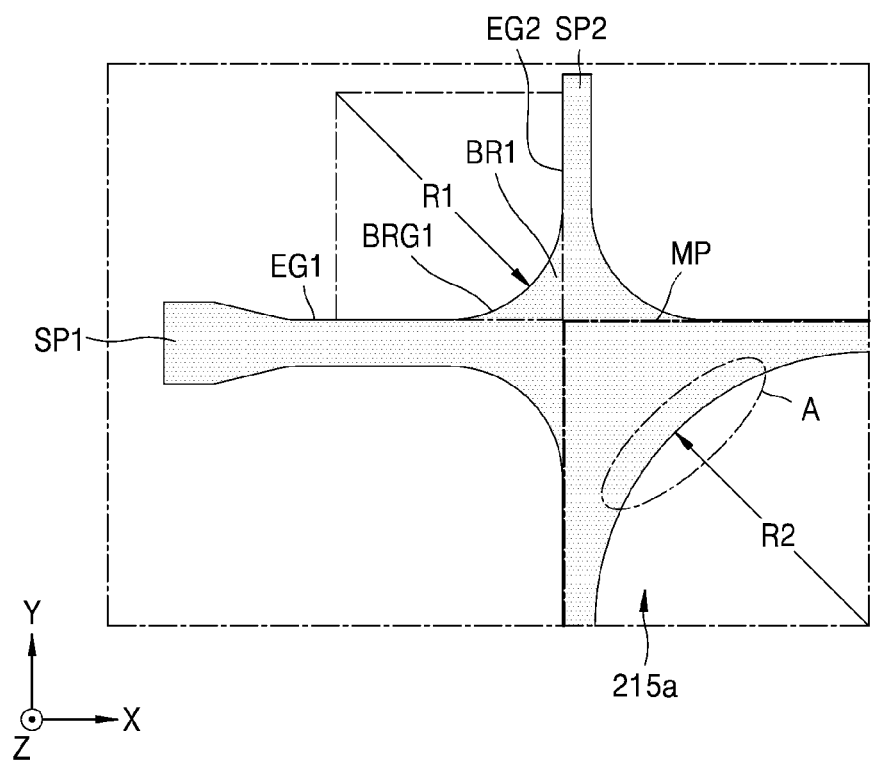
FIG. 6 is a plan view schematically illustrating a portion of an open mask of a mask-frame assembly according to an embodiment of the present disclosure.

FIG. 6 is a plan view schematically illustrating a portion of an open mask of a mask-frame assembly according to an embodiment of the present disclosure. As seen in this figure, the edge of the opening 215a which is closest to the first bridge portion BR1 among the plurality of openings 215 of the open mask 210, may include a portion A having a shape symmetrical to the shape of the edge BRG1 of the first bridge portion BR1 in the direction opposite to the direction toward the main portion MP. Conversely, it may be understood that the shape of the edge BRG1 of the first bridge portion BR1 in the direction opposite to the direction toward the main portion MP is symmetrical to the shape of the portion A of the opening 215a closest to the first bridge portion BR1.

Accordingly, as illustrated in FIG. 6, when the edge BRG1 of the first bridge portion BR1 in the direction opposite to the direction toward the main portion MP has the shape of a segment of a circle having a radius R1 and the portion A of the opening 215a closest to the first rib SP1 and the second rib SP2 has the shape of at least a segment of a circle having a radius R2, R1 may be equal to R2. Here, the portion A is a portion which is adjacent to the first rib SP1 and the second rib SP2.

Accordingly, a portion of the open mask 210 surrounded by the first rib SP1, the second rib SP2, and the opening 215a closest to the first bridge portion BR1 among the plurality of openings 215 of the open mask 210 may have the same shape as a portion of the open mask 210 surrounded by the openings 215 (e.g., a center portion of the open mask 210 of FIG. 3). As a result, the application of stress of a different magnitude than other portions to the portion A of the opening 215a closest to the first rib SP1 and the second rib SP2, which is adjacent to the first rib SP1 and the second rib SP2, may be minimized. When stress of a different magnitude than other portions is applied to the portion A of the opening 215a closest to the first rib SP1 and the second rib SP2, an unexpected localized deformation may occur in that portion.

Although the first rib SP1, the second rib SP2, and the first bridge portion BR1 have been described above, the disclosure is not necessarily limited thereto. As illustrated in FIG. 3, the open mask 210 may include a third rib SP3 and a second bridge portion BR2. The main portion MP, the first rib SP1, the second rib SP2, the third rib SP3, the first bridge portion BR1, and the second bridge portion BR2 may be integrally formed as one body as illustrated in FIG. 3.

The third rib SP3 may be connected to the main portion MP and may be spaced apart from the first rib SP1. Like the first rib SP1, the third rib SP3 may have a shape extending in the first direction (-x direction) away from the center of the main portion MP. Also, the second bridge portion BR2 may connect an edge MEG of a portion of the main portion MP between the third rib SP3 and the first rib SP1 to a third edge EG3 of the third rib SP3 in the direction toward the first rib SP1.

As described above, the open mask 210 may be coupled to the frame 230 in a state where a force directed outward from the center of the opening portion 235 of the frame 230 is applied to the open mask 210. Accordingly, the open mask 210 may be coupled to the frame 230 in a state where tension is applied to the third rib SP3 in the direction (-x direction) in which the third rib SP3 extends, like the first rib SP1.

When the open mask 210 does not include the second bridge portion BR2, the open mask 210 may have a shape similar to that illustrated in FIG. 5. FIG. 5 is a plan view schematically illustrating a mask-frame assembly according to a comparative example. In the case of the open mask 210 according to the comparative example, when tension is applied to the third rib SP3 in the direction (-x direction) in which the third rib SP3 extends, the shape of a portion of the opening closest to the third rib SP3, which is adjacent to the third rib SP3, may be deformed. Further, deformation of an uneven shape such as a wave may occur in an area between the third rib SP3 and the portion. This may eventually degrade the quality of a deposited layer, thus degrading the quality of a manufactured display apparatus or causing a defect in the display apparatus.

However, the open mask 210 included in the mask-frame assembly 200 according to the present embodiment may include a second bridge portion BR2 as described above with reference to FIG. 3. When tension is applied to the third rib SP3 in the direction (-x direction) in which the third rib SP3 extends, the second bridge portion BR2 may effectively prevent or minimize the concentration of stress on a portion of the opening close to the third rib SP3, which is adjacent to the third rib SP3. Accordingly, the deformation of the shape of the opening in the portion may be prevented or minimized.

As illustrated in FIG. 3, an edge BRG2 of the second bridge portion BR2 in the direction toward the first rib SP1 may have a concave shape in the direction toward an intersection point P between the edge MEG of the portion of the main portion MP between the third rib SP3 and the first rib SP1 and an imaginary straight line IL in the extension direction (-x direction) of the third rib SP3. For example, the edge BRG2 of the second bridge portion BR2 in the direction toward the first rib SP1 may have a curved shape. Accordingly, when tension is applied to the third rib SP3 in the direction (-x direction) in which the third rib SP3 extends, the tension may be effectively distributed in the second bridge portion BR2. This may effectively prevent or minimize the concentration of stress on a portion of an opening 215b closest to the intersection point P in the direction opposite to the direction toward the second bridge portion BR2 with respect to the intersection point P, which is adjacent to the third rib SP3.

For example, an edge of the opening 215b closest to the intersection point P in the direction opposite to the direction toward the second bridge portion BR2 with respect to the intersection point P among the plurality of openings 215 of the open mask 210 may include a portion A" having a shape substantially corresponding to the shape of the edge BRG2 of the second bridge portion BR2 in the direction toward the first rib SP1. Conversely, it may be understood that the shape of the edge BRG2 of the second bridge portion BR2 in the direction toward the first rib SP1 corresponds to the shape of the portion A" of the edge of the opening 215b closest to the intersection point P in the direction opposite to the direction toward the second bridge portion BR2 with respect to the intersection point P.

Accordingly, a portion of the open mask 210 surrounded by the third rib SP3 and the openings closest to intersection point P among the plurality of openings 215 of the open mask 210 may have a shape substantially similar to the shape of a portion of the open mask 210 surrounded by the openings 215 (e.g., a center portion of the open mask 210 of FIG. 3). As a result, the application of stress of a different magnitude than other portions to the portion A" of the edge of the opening 215b closest to the intersection point P in the direction opposite to the direction toward the second bridge portion BR2 with respect to the intersection point P may be minimized.

As described above with reference to FIG. 4, the portion A" of the edge of the opening 215b closest to the intersection point P in the direction opposite to the direction toward the second bridge portion BR2 with respect to the intersection point P may also have the shape of at least a segment of a circle having a radius R2. In this case, the edge BRG2 of the second bridge portion BR2 in the direction toward the first rib SP1 may also have the shape of a segment of a circle. For example, the edge BRG2 of the second bridge portion BR2 in the direction toward the first rib SP1 may have the shape of a segment of a circle having a radius R1. In this case, the radius R1 may be about 25% or more of the radius R2. In this regard, the above description may be equally applied to the edge BRG1 of the first bridge portion BR1.

Moreover, as described above with reference to FIG. 6, an edge of the opening 215b closest to the intersection point P in the direction opposite to the direction toward the second bridge portion BR2 with respect to the intersection point P among the plurality of openings 215 of the open mask 210 may include a portion having a shape symmetrical to the shape of the edge BRG2 of the second bridge portion BR2 in the direction toward the first rib SP1. Conversely, it may be understood that the shape of the edge BRG2 of the second bridge portion BR2 in the direction toward the first rib SP1 is symmetrical to the shape of the portion A" of the opening 215b closest to the intersection point P in the direction opposite to the direction toward the second bridge portion BR2 with respect to the intersection point P.

In this case, when the edge BRG2 of the second bridge portion BR2 in the direction toward the first rib SP1 has the shape of a segment of a circle having a radius R1 and the portion A" of the opening 215*b* closest to the intersection point P in the direction opposite to the direction toward the second bridge portion BR2 with respect to the intersection point P has the shape of at least a segment of a circle having a radius R2, R1 may be equal to R2. In this regard, the above description may be equally applied to the edge BRG1 of the first bridge portion BR1.

Figure 7:
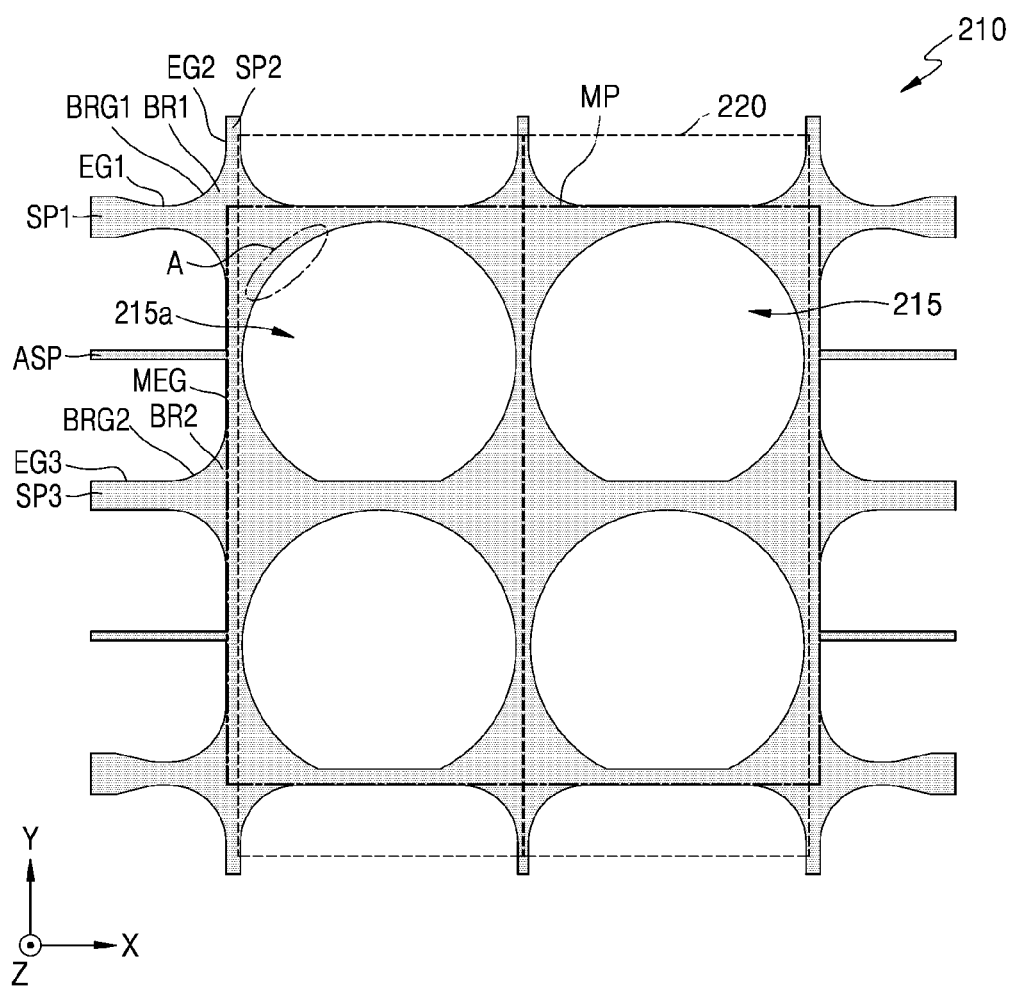
FIG. 7 is a plan view schematically illustrating an open mask of a mask-frame assembly according to an embodiment of the present disclosure.

FIG. 7 is a plan view schematically illustrating an open mask 210 of a mask-frame assembly 200 according to an embodiment of the present disclosure. The open mask 210 illustrated in FIG. 7 may be different from the open masks 210 of the mask-frame assembly 200 according to the above embodiments in that it further includes an auxiliary rib ASP. For example, the auxiliary rib ASP may be disposed between the first rib SP1 and the third rib SP3 and may have a shape extending in the first direction (−x direction) away from the center of the main portion MP like the first rib SP1 and the third rib SP3.

However, the same bridge portion as described above might not be disposed between the edge of the auxiliary rib ASP in the direction toward the first rib SP1 or the edge of the auxiliary rib ASP in the direction toward the third rib SP3 and the edge MEG of the portion of the main portion MP between the first rib SP1 and the third rib SP3. For example, the edge of the auxiliary rib ASP in the direction toward the first rib SP1 and the edge of the auxiliary rib ASP in the direction toward the third rib SP3 may vertically meet the edge MEG of the portion of the main portion MP between the first rib SP1 and the third rib SP3. This is because the open mask 210 may be coupled to the frame 230 in a state where tension is also applied to the auxiliary rib ASP but deformation of the opening 215 by the auxiliary rib ASP does not occur significantly.

For reference, because the mask stick 220 has a shape extending in one direction (y-axis direction), the auxiliary rib ASP may be connected to the edge (e.g., the edge MEG) of the main portion MP parallel to the one direction (y-axis direction). For example, the auxiliary rib ASP might not be in the edge of the main portion MP in a direction (x-axis direction) intersecting with the one direction (y-axis direction). This is to secure a space in which the mask stick 220 may be directly fixed to the frame 230.

Figure 8:
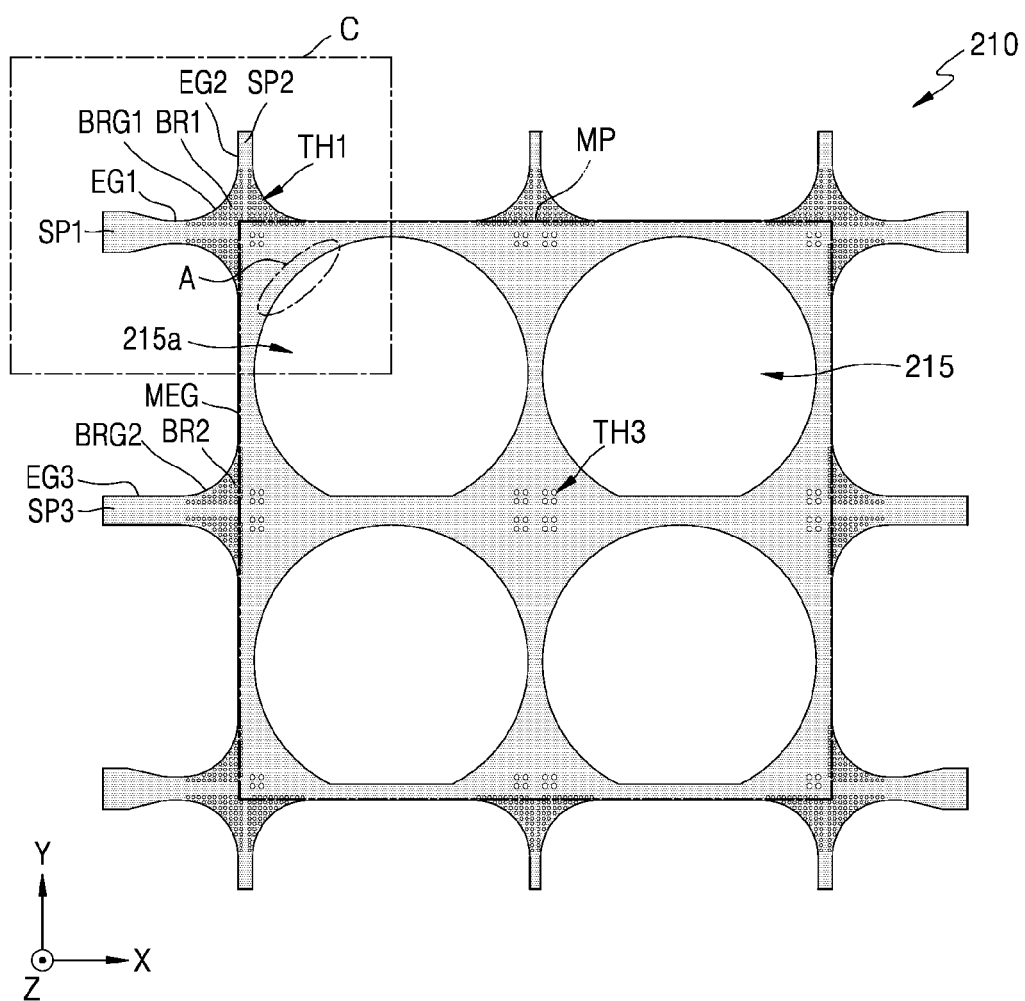
FIG. 8 is a plan view schematically illustrating an open mask of a mask-frame assembly according to an embodiment of the present disclosure.
Figure 9:
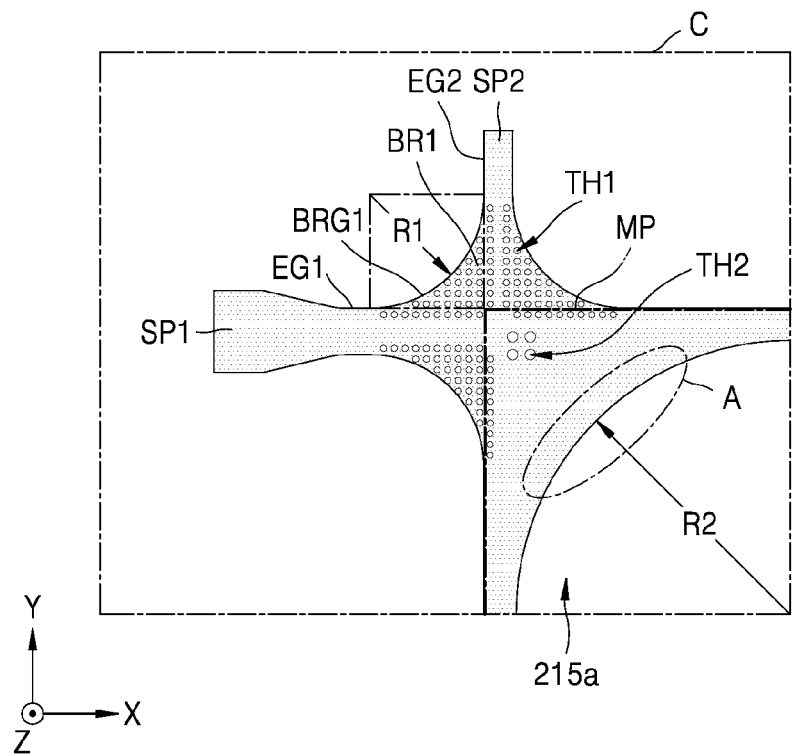
FIG. 9 is a plan view schematically illustrating region C of FIG. 8.

FIG. 8 is a plan view schematically illustrating an open mask 210 of a mask-frame assembly 200 according to an embodiment of the present disclosure, and FIG. 9 is a plan view schematically illustrating region C of FIG. 8. As illustrated in FIGS. 8 and 9, the open mask 210 may further include cleaning liquid discharge ports TH1 formed in the first bridge portion BR1.

The mask-frame assembly 200 might not be disposable (e.g. it may be reusable). However, a deposition material may be deposited on the mask-frame assembly 200 during a deposition process using the mask-frame assembly 200. Thus, before the reuse of the mask-frame assembly 200, as desired, a process of cleaning the mask-frame assembly 200 may be performed by immersing the mask-frame assembly 200 in a cleaning liquid. In this case, when the mask-frame assembly 200 is used in the deposition process in a state where the cleaning liquid is between the space between the open mask 210 and the mask stick 220, the cleaning liquid may leak in the deposition process, thus causing a defect in the product being manufactured.

In the case of the mask-frame assembly 200 according to the present embodiment, the open mask 210 may include cleaning liquid discharge ports TH1 formed in the first bridge portion BR1. Thus, in the cleaning process, the cleaning liquid that has penetrated into the space between the open mask 210 and the mask stick 220 may be easily discharged to the outside through the cleaning liquid discharge ports TH1.

Moreover, the cleaning liquid discharge ports TH1 may be located not only in the first bridge portion BR1 but also in the first rib SP1 as illustrated in FIG. 8. However, even in this case, the cleaning liquid discharge port TH1 might not be located on a central axis of the first rib SP1. This is to prevent the occurrence of a defect such as at least a portion of the first rib SP1 being disconnected in the process of the open mask 210 being coupled to the frame 230 in a state where tension is applied to the first rib SP1.

The cleaning liquid discharge ports TH1 may also be formed in the second bridge portion BR2 as illustrated in FIG. 8. As illustrated in FIG. 9, cleaning liquid discharge ports TH2 may also be formed between the first bridge portion BR1 and the portion A of the opening 215*a* closest to the first rib SP1 and the second rib SP2, which is adjacent to the first rib SP1 and the second rib SP2. In this case, the number of cleaning liquid discharge ports TH2 may be less than the number of cleaning liquid discharge ports TH1, but the area of each of the cleaning liquid discharge ports TH2 may be greater than the area of each of the cleaning liquid discharge ports TH1. As illustrated in FIG. 8, cleaning liquid discharge ports TH3 may also be formed between the openings 215 of the open mask 210. The area of each of the cleaning liquid discharge ports TH3 may be greater than the area of each of the cleaning liquid discharge ports TH1. For example, the area of each of the cleaning liquid discharge ports TH3 may be equal to the area of each of the cleaning liquid discharge ports TH2.

Figure 10:
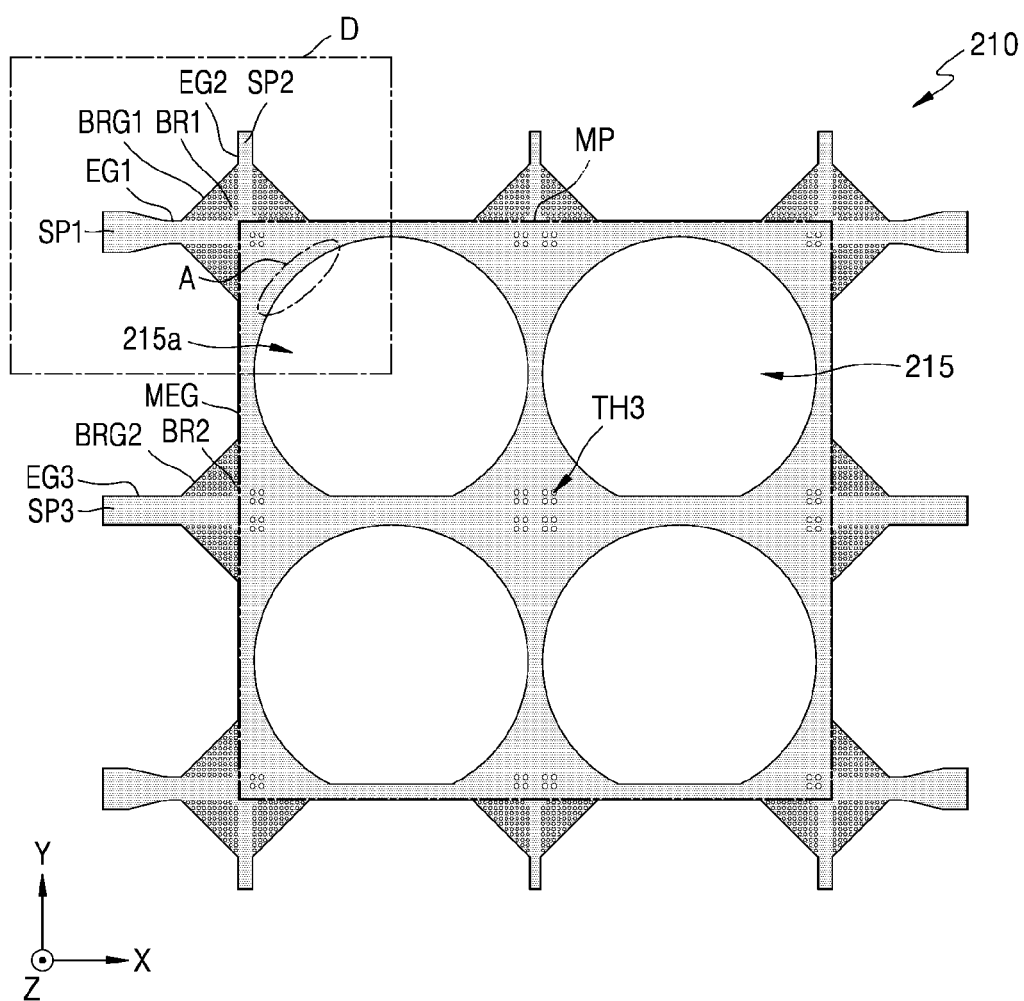
FIG. 10 is a plan view schematically illustrating an open mask of a mask-frame assembly according to an embodiment of the present disclosure.
Figure 11:
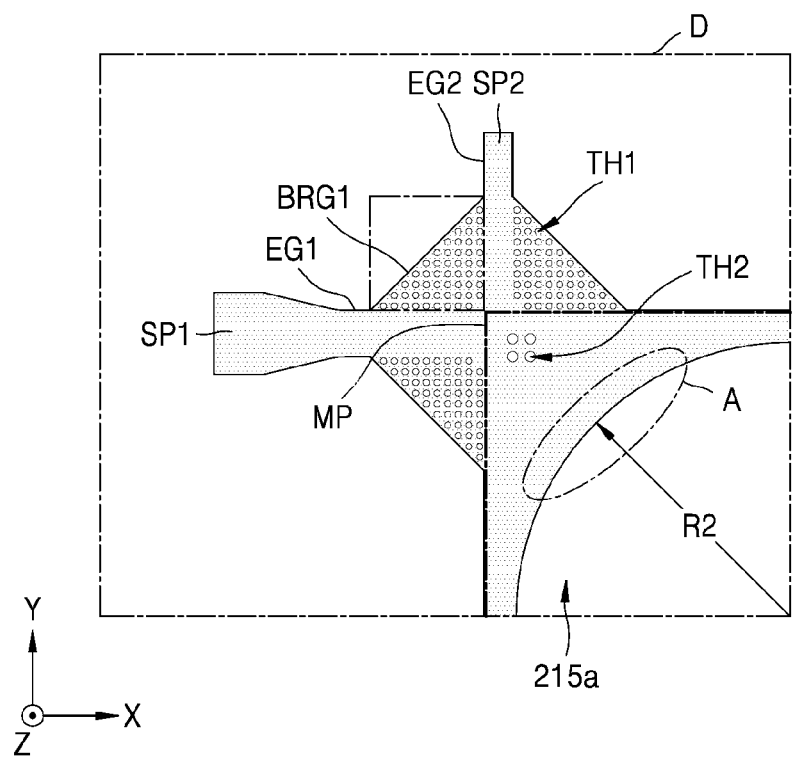
FIG. 11 is a plan view schematically illustrating region D of FIG. 10.

FIG. 10 is a plan view schematically illustrating an open mask of a mask-frame assembly according to an embodiment of the present disclosure, and FIG. 11 is a plan view schematically illustrating region D of FIG. 10. As illustrated in FIGS. 10 and 11, the edge BRG1 of the first bridge portion BR1 in the direction opposite to the direction toward the main portion MP may have a linear shape. In this case, the portion A of the opening 215*a* closest to the first rib SP1 and the second rib SP2, which is adjacent to the first rib SP1 and the second rib SP2, may have the shape of at least a segment of a circle having a radius R2. Also, the length of the edge BRG1 of the first bridge portion BR1 in the direction opposite to the direction toward the main portion MP may be about 35% to about 100% of R2.

When the length of the edge BRG1 of the first bridge portion BR1 is less than about 35% of R2, the area of the first bridge portion BR1 may be insufficient. As a result, when tension is applied to the first rib SP1 in the direction (−x direction) in which the first rib SP1 extends and tension is applied to the second rib SP2 in the direction (+y direction) in which the second rib SP2 extends, the tension might not be effectively distributed in the first bridge portion BR1. This may result in the deformation of the shape of the portion A of the opening closest to the first rib SP1 and the second rib SP2, which is adjacent to the first rib SP1 and the second rib SP2. Further, deformation of an uneven shape such as a wave may occur in an area A' between the first rib SP1 and/or the second rib SP2 and the portion A. This may eventually degrade the quality of a deposited layer, thus degrading the quality of a manufactured display apparatus or causing a defect in the display apparatus. Thus, for example, the length of the edge BRG1 of the first bridge portion BR1 may be about 35% or more of R2.

When the length of the edge BRG1 of the first bridge portion BR1 is more than about 100% of R2, this may cause a situation in that a space for coupling the mask stick 220 to the frame 230 becomes insufficient. As described above with reference to FIG. 7, the mask stick 220 may have a shape extending in one direction (y-axis direction), and both ends (in the +y direction and the −y direction) of the mask stick 220 may be directly fixed to the frame 230. When the length of the edge BRG1 of the first bridge portion BR1 is more than about 100% of R2, a space in which both ends (in the +y direction and the −y direction) of the mask stick 220 may be directly fixed to the frame 230 might not be secured. Thus, for example, the length of the edge BRG1 of the first bridge portion BR1 may be about 100% or less of R2.

Moreover, as illustrated in FIGS. 10 and 11, the open mask 210 may further include cleaning liquid discharge ports TH1 formed in the first bridge portion BR1.

The mask-frame assembly 200 may be reusable. However, a deposition material may be deposited on the mask-frame assembly 200 during a deposition process using the mask-frame assembly 200. Thus, before the reuse of the mask-frame assembly 200, as desired, a process of cleaning the mask-frame assembly 200 may be performed by immersing the mask-frame assembly 200 in a cleaning liquid. In this case, when the mask-frame assembly 200 is used in the deposition process in a state where the cleaning liquid is between the space between the open mask 210 and the mask stick 220, the cleaning liquid may leak in the deposition process, thus causing a defect in the product being manufactured.

In the case of the mask-frame assembly 200, according to the present embodiment, the open mask 210 may include cleaning liquid discharge ports TH1 formed in the first bridge portion BR1. Thus, in the cleaning process, the cleaning liquid that has penetrated into the space between the open mask 210 and the mask stick 220 may be easily discharged through the cleaning liquid discharge ports TH1.

Moreover, as illustrated in FIG. 11, cleaning liquid discharge ports TH2 may also be formed between the first bridge portion BR1 and the portion A of the opening 215*a* closest to the first rib SP1 and the second rib SP2, which is adjacent to the first rib SP1 and the second rib SP2. In this case, the number of cleaning liquid discharge ports TH2 may be less than the number of cleaning liquid discharge ports TH1, but the area of each of the cleaning liquid discharge ports TH2 may be greater than the area of each of the cleaning liquid discharge ports TH1. As illustrated in FIG. 10, cleaning liquid discharge ports TH3 may also be formed between the openings 215 of the open mask 210. The area of each of the cleaning liquid discharge ports TH3 may be greater than the area of each of the cleaning liquid discharge ports TH1. For example, the area of each of the cleaning liquid discharge ports TH3 may be equal to the area of each of the cleaning liquid discharge ports TH2.

In the case of the mask-frame assembly described above, the opening 215 of the open mask 210 may have a shape other than that of a square or a rectangle in the plan view. For example, when the edge of the opening 215 has the shape of a segment of a circle or the shape of a segment of an ellipse, the above remarkable effect may be obtained by making the open mask 210 have the same structure as described above.

Figure 12:
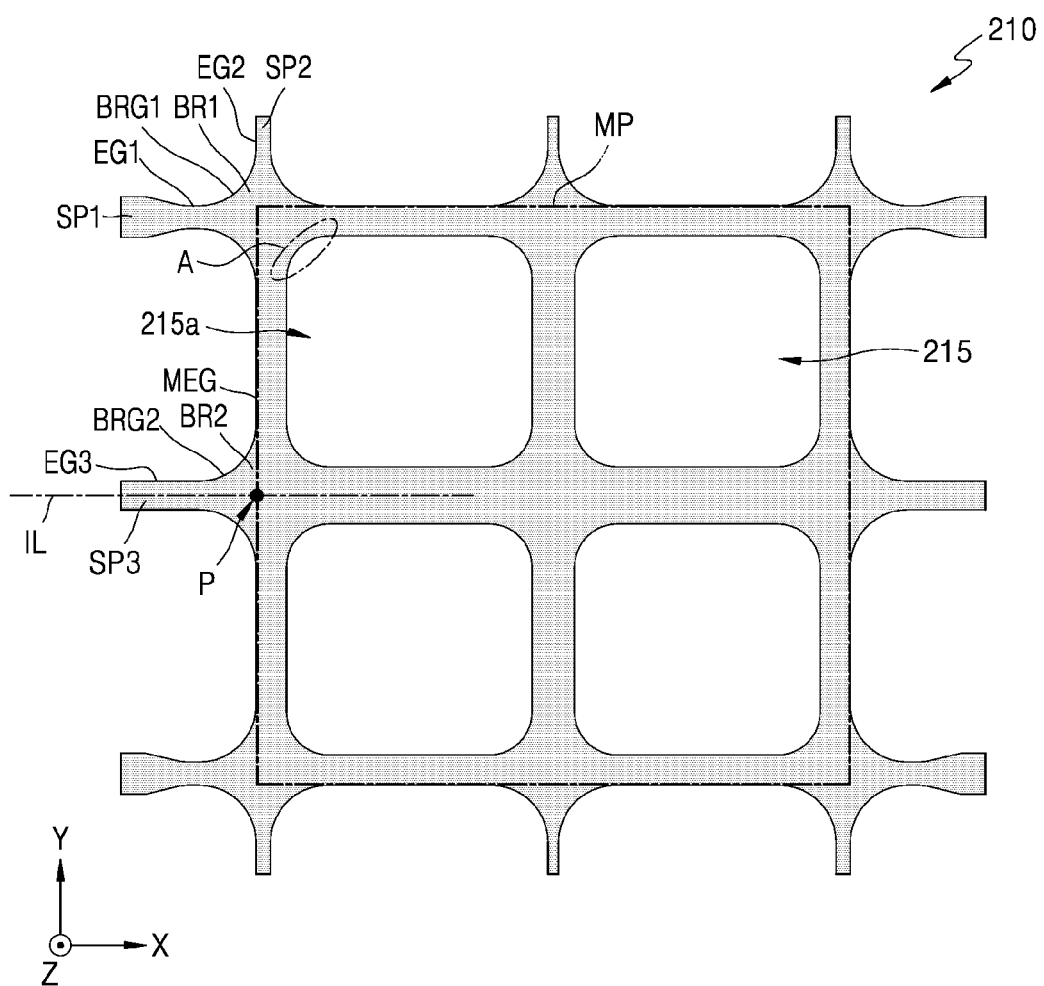
FIG. 12 is a plan view schematically illustrating an open mask of a mask-frame assembly according to an embodiment of the present disclosure.
Figure 13:
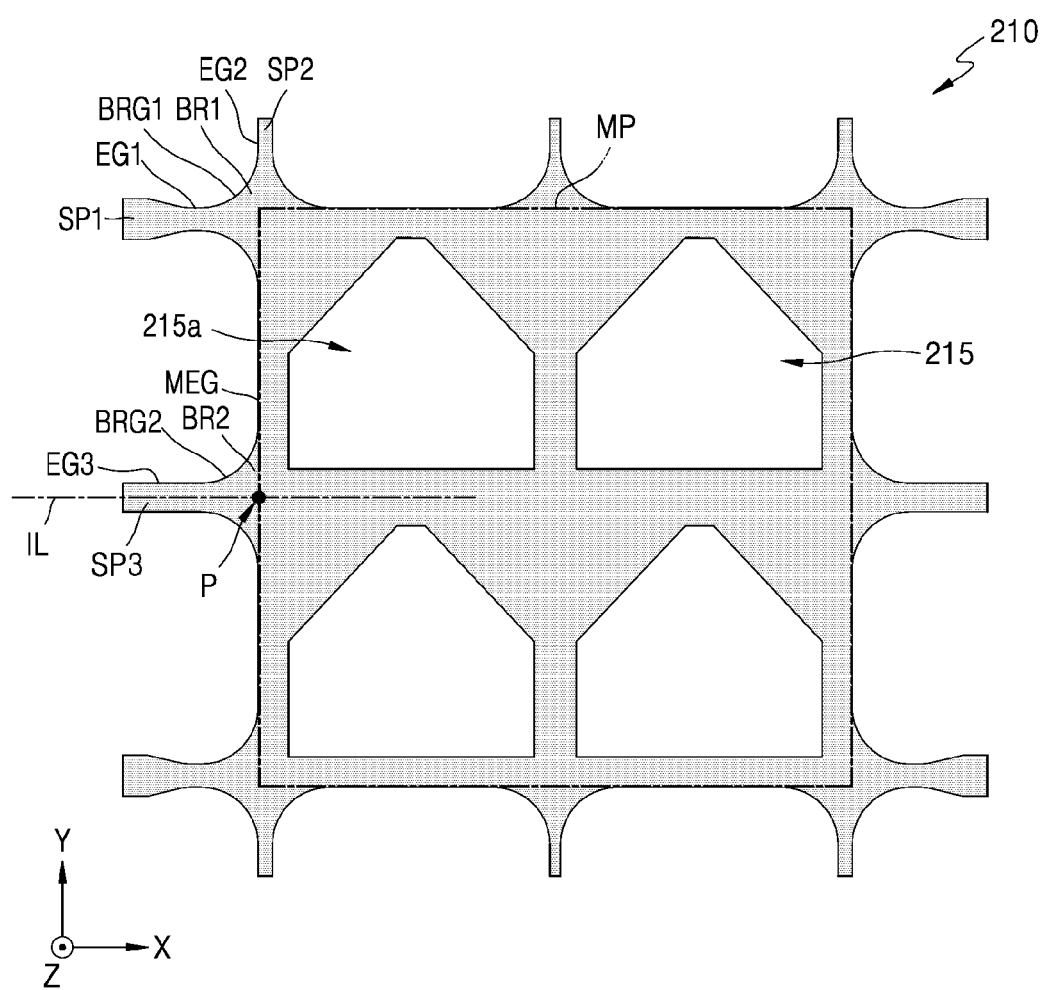
FIG. 13 is a plan view schematically illustrating an open mask of a mask-frame assembly according to an embodiment of the present disclosure.

FIG. 12 is a plan view schematically illustrating an open mask 210 of a mask-frame assembly 200 according to an embodiment of the present disclosure. The descriptions of the above embodiments may also be applied even in a case where each of the openings 215 of the open mask 210 has a generally square shape with a round edge in the plan view. For example, the first bridge portion BR1 described above may be disposed between the first rib SP1 and the second rib SP2. FIG. 13 is a plan view schematically illustrating an open mask of a mask-frame assembly according to an embodiment of the present disclosure. The descriptions of the above embodiments may also be applied in a case where each of the openings 215 of the open mask 210 has a polygonal shape other than a rectangular shape in the plan view. For example, the first bridge portion BR1 described above may be disposed between the first rib SP1 and the second rib SP2. For reference, FIG. 13 illustrates that each of the openings 215 of the open mask 210 has a polygonal shape with six sides (e.g. an irregular hexagon). For reference, all of a plurality of openings 215 of one open mask 210 might not necessarily have the same shape. For example, the opening 215 illustrated in FIG. 3 and the opening 215 illustrated in FIG. 12 may be mixed in one open mask 210 according to various modifications.

Although the mask-frame assembly 200 has been described above, the disclosure is not necessarily limited thereto. For example, the deposition apparatus described above with reference to FIG. 1 may also be within the scope of the disclosure. In addition, a method of manufacturing a display apparatus by using the mask-frame assembly 200 described above may also be within the scope of the disclosure.

For example, an organic light emitting display apparatus may be manufactured by forming a pixel electrode over a substrate, forming an intermediate layer over the pixel electrode by using any one of the mask-frame assemblies 200 described above, and then forming an opposite electrode over the intermediate layer.

Figure 14:
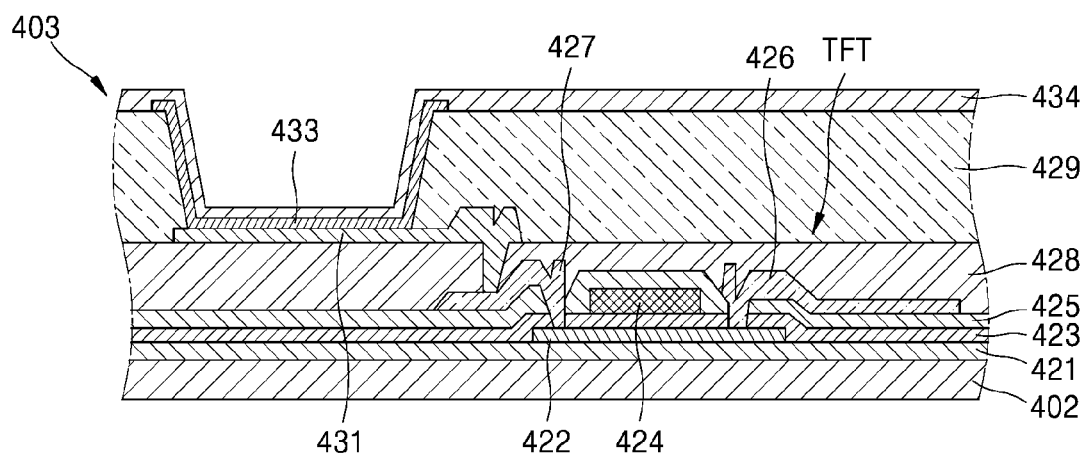
FIG. 14 is a cross-sectional view schematically illustrating a portion of an organic light emitting display apparatus manufactured according to an embodiment of the present disclosure.

FIG. 14 is a cross-sectional view schematically illustrating a portion of an organic light emitting display apparatus manufactured as such. As illustrated in FIG. 14, each pixel of an organic light emitting display apparatus 403 may include at least one thin film transistor TFT. The thin film transistor TFT might not necessarily be limited to the structure illustrated in FIG. 14, and the number of TFTs and the structure thereof may be variously modified.

As illustrated in FIG. 14, a buffer layer 421 may be formed of silicon oxide, silicon nitride, and/or silicon oxynitride over a substrate 402 formed of glass or polymer resin such as glass or acryl, polyimide, polycarbonate, or polyester, and a thin film transistor TFT may be formed over the buffer layer 421.

The thin film transistor TFT may include a semiconductor layer 422 formed over the buffer layer 421 and a gate electrode 424 thereover. The gate electrode 424 may be connected to a gate line for applying a thin film transistor on/off signal. Also, an area in which the gate electrode 424 is formed may correspond to a channel area of the semiconductor layer 422. A gate insulating layer 423 including silicon oxide, silicon nitride, and/or silicon oxynitride may be disposed between the semiconductor layer 422 and the gate electrode 424.

An interlayer insulating layer 425 may be formed over the gate electrode 424, and a source electrode 426 and a drain electrode 427 connected to a source area and a drain area of the semiconductor layer 422 through contact holes formed in the interlayer insulating layer 425 and the gate insulating layer 423 may be formed over the interlayer insulating layer 425.

A passivation layer and/or a planarization layer 428 may be formed over the source electrode 426 and the drain electrode 427, and a pixel definition layer 429 including acryl or polyimide may be formed thereover.

An organic light emitting device may be connected to the drain electrode 427. A pixel electrode 431 of the organic light emitting device may be formed over the passivation layer and/or the planarization layer 428, the pixel definition layer 429, which is insulative, may be formed thereover, and an intermediate layer 433 including at least an emission layer may be formed in a certain opening portion provided in the pixel definition layer 429. FIG. 14 illustrates that the intermediate layer 433 is patterned to correspond only to each pixel; however, this is illustrated as such for convenience to describe the configuration of each pixel, and the intermediate layer 433 may be integrally formed as one body in adjacent pixels according to an example of various modifications. Also, when the intermediate layer 433 is made of multiple layers, only some layers thereof may be integrally formed as one body in adjacent subpixels.

The pixel electrode 431 may be a transparent electrode or a reflective electrode. When the pixel electrode 431 is a transparent electrode, the pixel electrode 431 may include a layer formed of ITO, IZO, ZnO, or $In_2O_3$, and when the pixel electrode 431 is a reflective electrode, the pixel electrode 431 may include a reflective layer formed of Ag, Mg, Al, Pt, Pd, Au, Ni, Nd, Ir, Cr, or any compound thereof and a layer formed of ITO, IZO, ZnO, or $In_2O_3$.

The intermediate layer 433 including at least an emission layer may have a structure in which a hole injection layer (HIL), a hole transport layer (HTL), an organic emission layer (EML), an electron transport layer (ETL), and/or an electron injection layer (EIL) are stacked in a single or complex structure. These layers may be formed by vacuum deposition by using the mask-frame assembly 200 as described above.

An opposite electrode 434 may also be a transparent electrode or a reflective electrode. When the opposite electrode 434 is a transparent electrode, the opposite electrode 434 may include a layer formed of a metal having a low work function, for example, Li, Ca, LiF/Ca, LiF/Al, Al, Mg, or any compound thereof, and a layer formed of ITO, IZO, ZnO, or $In_2O_3$. As used herein, the phrase "low work function metal" may be understood to mean any metal having a work function that is equal to or lower than that of any of the aforementioned low work function metals. When the opposite electrode 434 is a reflective electrode, the opposite electrode 434 may include a layer formed of Li, Ca, LiF/Ca, LiF/Al, Al, Mg, or any compound thereof.

When manufacturing such an organic light emitting display apparatus, by using the above mask-frame assembly in the process of forming the intermediate layer 433 and the like, the occurrence of a defect in the manufacturing process may be prevented.

As described above, according to an embodiment, a mask-frame assembly in which deformation of a deposition area is minimized and a method of manufacturing an organic light emitting display apparatus by using the mask-frame assembly may be implemented. However, the scope of the disclosure is not necessarily limited to these effects.

It should be understood that embodiments described herein should be considered in a descriptive sense. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A mask-frame assembly, comprising:
a frame including an opening portion;
an open mask coupled to the frame and covering the opening portion, the open mask including a main portion including a plurality of openings located within the opening portion, a first rib connected to the main portion and extending in a first direction away from a center of the main portion, a second rib connected to the main portion and extending in a second direction that crosses the first direction and extending away from the center of the main portion, and a first bridge portion connecting a first edge of the first rib in a direction toward the second rib to a second edge of the second rib in a direction toward the first rib; and
a plurality of mask sticks overlapping the open mask, each of the plurality of mask sticks having opposite ends coupled to the frame,
wherein each of the plurality of mask sticks includes a plurality of holes.

2. The mask-frame assembly of claim 1, wherein the main portion, the first rib, the second rib, and the first bridge portion are all integrally formed as one contiguous body.

3. The mask-frame assembly of claim 1, wherein an edge of the first bridge portion in a direction opposite to a direction toward the main portion has a concave shape in the direction toward the main portion.

4. The mask-frame assembly of claim 3, wherein an edge of the first bridge portion in the direction opposite to the direction toward the main portion has a curved shape.

5. The mask-frame assembly of claim 3, wherein an edge of an opening closest to the first bridge portion among the plurality of openings includes a portion having a shape that is symmetrical with respect to a shape of the edge of the first bridge portion in the direction opposite to the direction toward the main portion.

6. The mask-frame assembly of claim 5, wherein the edge of the first bridge portion in the direction opposite to the direction toward the main portion has a shape of a segment of a circle having a radius R1.

7. The mask-frame assembly of claim 3, wherein the edge of the first bridge portion in the direction opposite to the direction toward the main portion has a shape of a segment of a circle having a radius R1.

8. The mask-frame assembly of claim 7, wherein an edge of an opening closest to the first bridge portion among the plurality of openings has a shape of at least a segment of a circle having a radius R2.

9. The mask-frame assembly of claim 8, wherein the radius R1 is about 25% or more of the radius R2.

10. The mask-frame assembly of claim 1, wherein the open mask further includes a third rib connected to the main portion, spaced apart from the first rib, and extending in the first direction, and a second bridge portion connecting an edge of a portion of the main portion between the third rib and the first rib to a third edge of the third rib in the direction toward the first rib.

11. The mask-frame assembly of claim 10, wherein the main portion, the first rib, the second rib, the third rib, the first bridge portion, and the second bridge portion are all integrally formed as one contiguous body.

12. The mask-frame assembly of claim 10, wherein an edge of the second bridge portion in the direction toward the first rib has a concave shape in a direction toward an intersection point between the edge of the portion of the main portion.

13. The mask-frame assembly of claim 12, wherein the edge of the second bridge portion in the direction toward the first rib has a curved shape.

14. The mask-frame assembly of claim 12, wherein an edge of an opening among the plurality of openings which is closest to the intersection point in a direction opposite to a direction toward the second bridge portion with respect to the intersection point, includes a portion having a shape that is symmetrical with respect to a shape of an edge of the second bridge portion in a direction opposite to the direction toward the intersection point.

15. The mask-frame assembly of claim 14, wherein the edge of the second bridge portion in the direction toward the first rib has a shape of a segment of a circle having a radius R1.

16. The mask-frame assembly of claim 12, wherein the edge of the second bridge portion in the direction toward the first rib has a shape of a segment of a circle having a radius R1.

17. The mask-frame assembly of claim 16, wherein an edge of an opening among the plurality of openings which is closest to the intersection point in a direction opposite to a direction toward the second bridge portion with respect to the intersection point, has a shape of at least a segment of a circle having a radius R2.

18. The mask-frame assembly of claim 17, wherein the radius R1 is about 25% or more of the radius R2.

19. The mask-frame assembly of claim 1, wherein an edge of the first bridge portion in a direction opposite to a direction toward the main portion has a linear shape.

20. The mask-frame assembly of claim 19, wherein an edge of an opening among the plurality of openings which is closest to the first bridge portion has a shape of at least a segment of a circle having a radius R2, and
wherein a length of the edge of the first bridge portion in the direction opposite to the direction toward the main portion is about 35% or more of the radius R2 and is about 100% or less of the radius R2.

21. The mask-frame assembly of claim 1, further comprising a cleaning liquid discharge port disposed at the first bridge portion.

22. A method of manufacturing an organic light emitting display apparatus, the method comprising:
forming a pixel electrode over a substrate;
forming an intermediate layer over the pixel electrode by using a mask-frame assembly; and
forming an opposite electrode over the intermediate layer, wherein the mask-frame assembly comprises:
  a frame including an opening portion;
  an open mask coupled to the frame and covering the opening portion, the open mask including a main portion including a plurality of openings located within the opening portion, a first rib connected to the main portion and extending in a first direction away from a center of the main portion, a second rib connected to the main portion and extending in a second direction that crosses the first direction and extending away from the center of the main portion, and a first bridge portion connecting a first edge of the first rib in a direction toward the second rib to a second edge of the second rib in a direction toward the first rib; and
  a plurality of mask sticks overlapping the open mask, each of the plurality of mask sticks having opposite ends coupled to the frame,
  wherein each of the plurality of mask sticks includes a plurality of holes.

23. A mask-frame assembly, comprising:
a frame including an open portion; and
an open mask coupled to the frame, the open mask including a first rib extending in a first direction, a second rib extending in a second direction that is different from the first direction, and a bridge portion that connects the first rib and the second rib, the bridge portion having a curved shape,
wherein the open mask further includes a plurality of openings.

24. The mask-frame assembly of claim 23, wherein each of the plurality of openings corresponds to a display apparatus to be manufactured.

25. The mask-frame assembly of claim 23, wherein each of the plurality of openings has a shape of a circle segment.

* * * * *